United States Patent [19]
Jang et al.

[11] Patent Number: 5,721,172
[45] Date of Patent: Feb. 24, 1998

[54] SELF-ALIGNED POLISH STOP LAYER HARD MASKING METHOD FOR FORMING PLANARIZED APERTURE FILL LAYERS

[75] Inventors: Syun-Ming Jang, Hsin-chu; Ying-Ho Chen, Taipei; Chen-Hua Yu, Hsin-chu, all of Taiwan

[73] Assignee: Taiwan Semiconductor Manufacturing Company, Ltd., Hsin-Chu, Taiwan

[21] Appl. No.: 759,242

[22] Filed: Dec. 2, 1996

[51] Int. Cl.$^6$ .......................... H01L 21/82; H01L 21/76
[52] U.S. Cl. .................... 438/424; 438/633; 438/699; 216/88; 216/38
[58] Field of Search .................. 437/195, 228, 437/228 PL, 238; 156/636.1, 662.1; 438/633, 634, 692, 697, 699, 424; 216/88, 38

[56] References Cited

U.S. PATENT DOCUMENTS

| | | | |
|---|---|---|---|
| 4,954,459 | 9/1990 | Avanzino et al. | 437/228 |
| 4,962,064 | 10/1990 | Haskell et al. | 437/228 |
| 5,015,602 | 5/1991 | Van Der Plas et al. | 437/228 |
| 5,173,439 | 12/1992 | Dash et al. | 437/228 |
| 5,275,965 | 1/1994 | Manning | 437/67 |
| 5,290,396 | 3/1994 | Schoenborn et al. | 156/636 |
| 5,298,110 | 3/1994 | Schoenborn et al. | 156/636.1 |
| 5,350,486 | 9/1994 | Huang | 437/228 |
| 5,362,669 | 11/1994 | Boyd et al. | 437/67 |
| 5,387,539 | 2/1995 | Yang et al. | 437/228 |
| 5,441,094 | 8/1995 | Pasch | 156/636.1 |
| 5,491,113 | 2/1996 | Murota | 156/636.1 |
| 5,498,565 | 3/1996 | Gocho et al. | 437/67 |
| 5,663,107 | 9/1997 | Peschke et al. | 438/692 |
| 5,665,202 | 9/1997 | Subramanian et al. | 216/88 |

*Primary Examiner*—Charles L. Bowers, Jr.
*Assistant Examiner*—Matthew Whipple
*Attorney, Agent, or Firm*—George O. Saile; Stephen B. Ackerman; Alek P. Szecsy

[57] ABSTRACT

A method for forming, without dishing, a planarized aperture fill layer within an aperture within a substrate. There is first provided a substrate having an aperture formed therein. There is then formed upon the substrate and within the aperture a conformal aperture fill layer, where the conformal aperture fill layer is thicker than the depth of the aperture. There is then formed upon the conformal aperture fill layer a conformal polish stop layer having a lower planar region of the conformal polish stop layer where the conformal aperture fill layer is formed within the aperture. The conformal polish stop layer and the conformal aperture fill layer are then planarized through a first chemical mechanical polish (CMP) planarizing method until there is reached the lower planar region of the conformal polish stop layer, while simultaneously forming a patterned polish stop layer and a partially chemical mechanical polish (CMP) planarized aperture fill layer. The patterned polish stop layer is then employed as a etch mask to form an etched partially chemical mechanical polish (CMP) planarized aperture fill layer with a protrusion over the aperture, where the height of the protrusion compensates for a dish which would otherwise form when the etched partially chemical mechanical polish (CMP) planarized aperture fill layer is planarized through a second chemical mechanical polish (CMP) method to form a planarized aperture fill layer within the aperture.

19 Claims, 8 Drawing Sheets

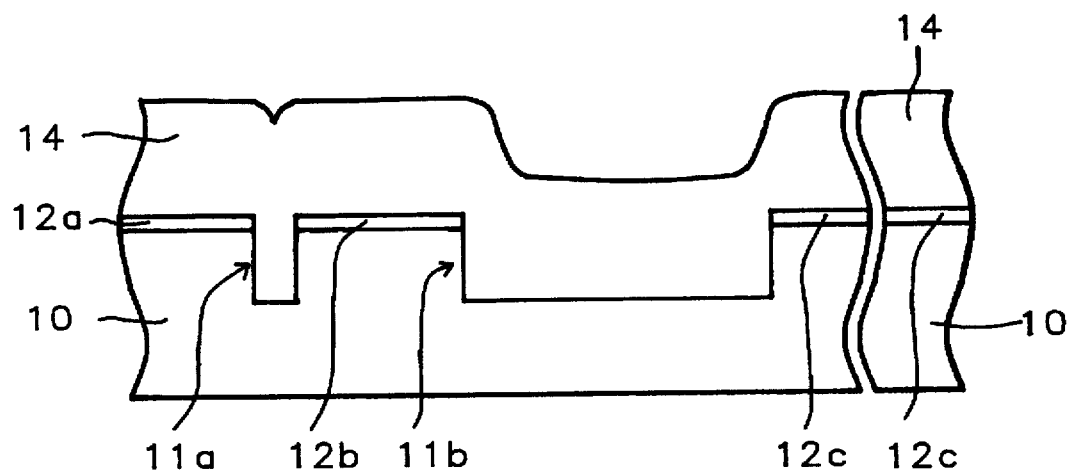
*FIG. 1 - Prior Art*
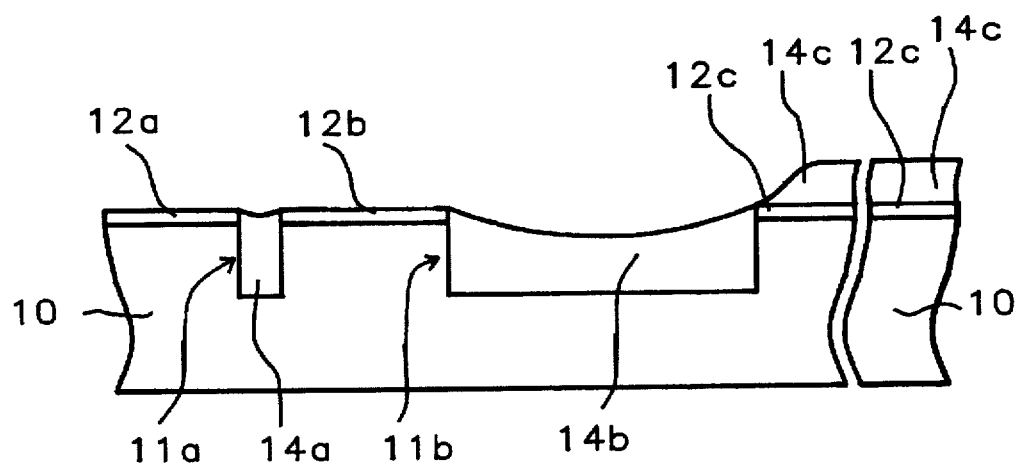
*FIG. 2 - Prior Art*

5,721,172

SELF-ALIGNED POLISH STOP LAYER HARD MASKING METHOD FOR FORMING PLANARIZED APERTURE FILL LAYERS

BACKGROUND OF THE INVENTION

1. Field of the Invention

The present invention relates generally to methods for filling apertures with aperture fill layers within integrated circuits. More particularly, the present invention relates to chemical mechanical polish (CMP) planarizing methods for filling, while avoiding dishing, apertures with planarized aperture fill layers within integrated circuits.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

As integrated circuit technology has advanced and integrated circuit device dimensions have decreased, it has become increasingly common within advanced integrated circuits to employ trench isolation methods such as shallow trench isolation (STI) methods and recessed oxide isolation (ROI) methods to form trench isolation regions nominally co-planar with adjoining active semiconductor regions of semiconductor substrates. Such trench isolation methods typically employ a chemical mechanical polish (CMP) planarizing method to provide a nominally planarized surface to a trench fill dielectric layer formed within a trench. Trench isolation regions nominally co-planar with active semiconductor regions within semiconductor substrates are desirable since they optimize, when subsequently forming patterned layers upon those nominally co-planar trench isolation regions and active semiconductor regions, the limited depth of focus typically achievable with advanced photoexposure tooling.

While trench isolation methods employing chemical mechanical polish (CMP) planarizing of trench fill dielectric layers formed into isolation trenches are therefore quite desirable and common in the art of advanced integrated circuit fabrication, such trench isolation methods are nonetheless not entirely without problems. In particular, it is known in the art that trench isolation methods employing chemical mechanical polish (CMP) planarizing of trench fill dielectric layers formed into trenches often, when the trenches are comparatively wide, provide trenches where a planarized trench fill dielectric layer formed therein has dished. The dishing phenomenon is illustrated by reference to the schematic cross-sectional diagrams of FIG. 1 and FIG. 2.

Shown in FIG. 1 is a substrate 10 having formed therein a narrow trench 11a and a wide trench 11b. Defining the narrow trench 11a and the wide trench 11b are polish stop layers 12a, 12b and 12c formed upon the surface of the substrate 10. Formed over the substrate 10 and into both the narrow trench 11a and the wide trench 11b is a blanket conformal trench fill layer 14. Shown in FIG. 2 is the results of planarizing through a conventional chemical mechanical polish (CMP) planarizing method the blanket conformal trench fill layer 14 as illustrated in FIG. 1.

Shown in FIG. 2 are the planarized trench fill layers 14a and 14b formed, respectively, into the narrow trench 11a and the wide trench 11b through a chemical mechanical polish (CMP) planarizing method practiced upon the blanket conformal trench fill layer 14 as illustrated in FIG. 1. As shown in FIG. 2, the surface of the planarized trench fill layer 14b is substantially dished in comparison with the surface of the planarized trench fill layer 14a. Such dishing is common in the art of integrated circuit fabrication since trench fill layers, which are often formed of silicon oxide dielectric materials, are typically softer than polish stop layers, which are typically formed of silicon nitride materials. Such dishing is also exceedingly common in the art of integrated circuit fabrication when wide trenches, such as the wide trench 11b, have a width of greater than about 1000 microns, although such dishing is also substantially avoided in the art of integrated circuit fabrication when narrow trenches, such as the narrow trench 11a, have a width of less than about 0.4 microns. Thus, due in part to flexing of a chemical mechanical polish (CMP) polishing pad employed within the chemical mechanical polish (CMP) planarizing method, the planarized trench fill layer 14b is more dished in comparison with the planarized trench fill layer 14a.

There is also shown in FIG. 2 the presence of a planarized trench fill residue layer 14c formed simultaneously over the polish stop layer 12c when the blanket conformal trench fill layer 14 is polished through the chemical mechanical polish (CMP) method to form the planarized trench fill layers 14a and 14b. As is understood by a person skilled in the art, when the polish stop layer 12c is particularly large, generally of dimensions greater than about 1000 microns, the blanket conformal trench fill layer 14 will in addition to polishing more rapidly over the wide trench 11b and forming a dish within the planarized trench fill layer 14b simultaneously also polish more slowly over the polish stop layer 12c and leave the planarized trench fill residue layer 14c formed over the polish stop layer 12c. Planarized trench fill residue layers such as the planarized trench fill residue layer 14c are undesirable within integrated circuit fabrication since they typically further impede forming nominally co-planar planarized trench fill layers with adjoining active regions of semiconductor substrates within integrated circuits.

Trench isolation methods are in general known in the art of integrated circuit fabrication. See, for example Manning, U.S. Pat. No. 5,275,965. In addition, chemical mechanical polish (CMP) planarizing methods through which dishing may be avoided when chemical mechanical polish (CMP) planarizing trench fill dielectric layers within comparatively wide isolation trenches within semiconductor substrates are also known in the an of integrated circuit fabrication. See, for example, Schoenborn et al., U.S. Pat. No. 5,290,396 and Boyd et al., U.S. Pat. No. 5,362,669, each of which disclose a chemical mechanical polish (CMP) method for planarizing such a trench fill dielectric layer within a comparatively wide trench within a semiconductor substrate. The methods include forming a polish stop layer upon the trench fill dielectric layer within the trench, where the polish stop layer upon the trench fill dielectric layer within the trench is substantially co-planar with a second polish stop layer upon the semiconductor substrate within which is formed the trench. Further, Pasch, in U.S. Pat. No. 5,441,094 discloses a related method for planarizing field oxide (FOX) isolation regions within integrated circuits to form planarized field oxide (FOX) isolation regions substantially coplanar with adjoining active regions of a semiconductor substrate within which is formed the field oxide (FOX) isolation regions. Finally, Gocho et al., in U.S. Pat. No. 5,498,565 discloses an etch deposition method employing a masked isotropic etch step prior to a chemical mechanical polish (CMP) planarizing method for forming, without dishing, trench fill dielectric layers into isolation trenches within integrated circuits.

Desirable in the art are additional chemical mechanical polish (CMP) planarizing methods through which there may be avoided dishing of planarized aperture fill layers formed within apertures within substrates employed in integrated circuit fabrication. More desirable in the art are additional chemical mechanical polish (CMP) planarizing methods through which there may be avoided dishing of planarized aperture fill layers formed within apertures within substrates employed in integrated circuit fabrication, while simultaneously avoiding formation of planarized aperture fill residue layers upon portions of the substrates adjoining the apertures. Particularly desirable are additional chemical mechanical polish (CMP) planarizing methods through which there may be avoided dishing of planarized trench fill layers, such as planarized trench fill dielectric layers, formed within trenches, such as isolation trenches, within semiconductor substrates employed in integrated circuit fabrication. Most particularly desirable are additional chemical mechanical polish (CMP) planarizing methods through which there may be avoided dishing of planarized trench fill layers, such as planarized trench fill dielectric layers, formed within trenches, such as isolation trenches, within semiconductor substrates employed in integrated circuit fabrication, while simultaneously avoiding formation of planarized trench fill dielectric residue layers upon portions of the semiconductor substrates adjoining the trenches. It is towards these goals that the present invention is directed.

SUMMARY OF THE INVENTION

A first object of the present invention is to provide a chemical mechanical polish (CMP) planarizing method for forming a planarized aperture fill layer within an aperture within a substrate employed in integrated circuit fabrication.

A second object of the present invention is to provide a method in accord with the first object of the present invention, where there is avoided dishing of the planarized aperture fill layer formed within the aperture.

A third object of the present invention is to provide a method in accord with the fist object of the present invention and the second object of the present invention, where there is simultaneously also avoided formation of a planned aperture fill residue layer upon a portion of the substrate adjoining the aperture.

A fourth object of the present invention is to provide a method in accord with the first object of the present invention, the second object of the present invention or the third object of the present invention, where: (1) the substrate is a semiconductor substrate; (2) the aperture is a trench, such as an isolation trench, formed within the semiconductor substrate; and (3) the aperture fill layer is a trench fill layer, such as a trench fill dielectric layer.

A fifth object of the present invention is to provide a method in accord with the first object of the present invention, the second object of the present invention, the third object of the present invention or the fourth object of the present invention, which method is readily manufacturable.

In accord with the objects of the present invention, there is provided by the present invention a method for forming while avoiding dishing, a planarized aperture fill layer within an aperture within a substrate employed in integrated circuit fabrication. Through the method there may simultaneously also be avoided formation of planarized aperture fill residue layer upon the substrate at a location adjoining the aperture. To practice the method of the present invention, there is first provided a substrate which has an aperture formed within the substrate. There is then formed over the substrate and within the aperture a conformal aperture fill layer, where the conformal aperture fill layer is formed to a thickness greater than the depth of the aperture. There is then formed upon the conformal aperture fill layer a conformal polish stop layer, where the conformal polish stop layer has a lower planar region of the conformal polish stop layer where the conformal aperture fill layer is formed within the aperture. There is then planarized through a first chemical mechanical polish (CMP) planarizing method the conformal polish stop layer and the conformal aperture fill layer until there is reached the lower planar region of the conformal polish stop layer while simultaneously forming a patterned polish stop layer and a partially chemical mechanical polish (CMP) planarized aperture fill layer. There is then employed the patterned polish stop layer as an etch mask in etching portions of the partially chemical mechanical polish (CMP) planarized aperture fill layer over regions of the substrate other than the aperture to form an etched partially chemical mechanical polish (CMP) planarized aperture fill layer having a protrusion over the aperture, where the protrusion has a thickness which compensates for a dish otherwise formed within a planarized aperture fill layer within the aperture when forming from the etched partially chemical mechanical polish (CMP) planarized aperture fill layer the planarized aperture fill layer through a second chemical mechanical polish (CMP) planarizing method. Finally, there is employed the second chemical mechanical polish (CMP) planarizing method to form from the etched partially chemical mechanical polish (CMP) planarized aperture fill layer the planarized aperture fill layer.

There is provided by the present invention a chemical mechanical polish (CMP) planarizing method where there is avoided dishing when forming a planarized aperture fill layer within an aperture within an integrated circuit. By employing through the method of the present invention the patterned polish stop layer as an etch mask in forming an etched partially chemical mechanical polish (CMP) planarized aperture fill layer having a protrusion over the aperture, there is provided by the method of the present invention an etched partially chemical mechanical polish (CMP) planarized aperture fill layer through which there may be formed, while avoiding dishing, a planarized aperture fill layer.

Through the method of the present invention there may simultaneously be avoided formation of a planarized aperture fill residue layer upon a portion of the substrate adjoining the aperture. In addition to providing an etched partially chemical mechanical polish (CMP) planarized aperture fill layer through which there may be formed, while avoiding dishing, a planarized aperture fill layer, the protrusion over the aperture within the etched partially chemical mechanical polish (CMP) planarized aperture fill layer also provides an etched partially chemical mechanical polish (CHIP) planarized aperture fill layer through which there may simultaneously be avoided formation of a planarized aperture fill residue layer upon a portion of the substrate adjoining the aperture when the planarized aperture fill layer is formed within the aperture through the second chemical mechanical polish (CMP) planarizing method.

The present invention may be employed where: (1) the substrate is a semiconductor substrate; (2) the aperture is a trench, such as an isolation trench, formed within the semiconductor substrate; and (3) the aperture fill layer is a trench fill layer, such as a trench fill dielectric layer, formed within the trench within the semiconductor substrate. The method of the present invention does not discriminate with respect to the nature of the substrate, the nature of the aperture or the nature of the aperture fill layer, provided that the conformal polish stop layer employed within the method of the present invention provides both: (1) an effective polish stop when the aperture fill layer and the polish stop layer are chemical mechanical polish (CMP) planarized through the first chemical mechanical polish (CMP) method in forming the patterned polish stop layer and the partially chemical mechanical polish (CMP) planarized aperture fill layer; and (2) an effective etch mask layer in forming from the partially chemical mechanical polish (CMP) planarized aperture fill layer an etched partially chemical mechanical polish (CMP) planarized aperture fill layer having a protrusion over the aperture. Thus: (1) the substrate employed within the method of the present invention may be a substrate such as but not limited to a semiconductor substrate employed within integrated circuit fabrication; (2) the aperture within the substrate may be a trench, such as but not limited to an isolation trench, formed within the semiconductor substrate; and (3) the aperture fill layer may be a trench fill layer, such as but not limited to a trench fill dielectric layer, formed within the trench within the semiconductor substrate.

The method of the present invention is readily manufacturable. The method of the present invention employs a novel combination of integrated circuit fabrication methods which are otherwise generally known in the art of integrated circuit fabrication. Since it is the ordering of the integrated circuit fabrication methods and the parameters employed within the integrated circuit fabrication methods, rather than the existence of the integrated circuit fabrication methods, through which is provided the method of the present invention, the method of the present invention is readily manufacturable.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein:

FIG. 1 and FIG. 2 show a pair of schematic cross-sectional diagrams illustrating dishing within a planarized trench fill layer formed within a trench within a substrate through a chemical mechanical polish (CMP) planarizing method conventional in the art.

DESCRIPTION OF THE PREFERRED EMBODIMENTS

Figure 3:
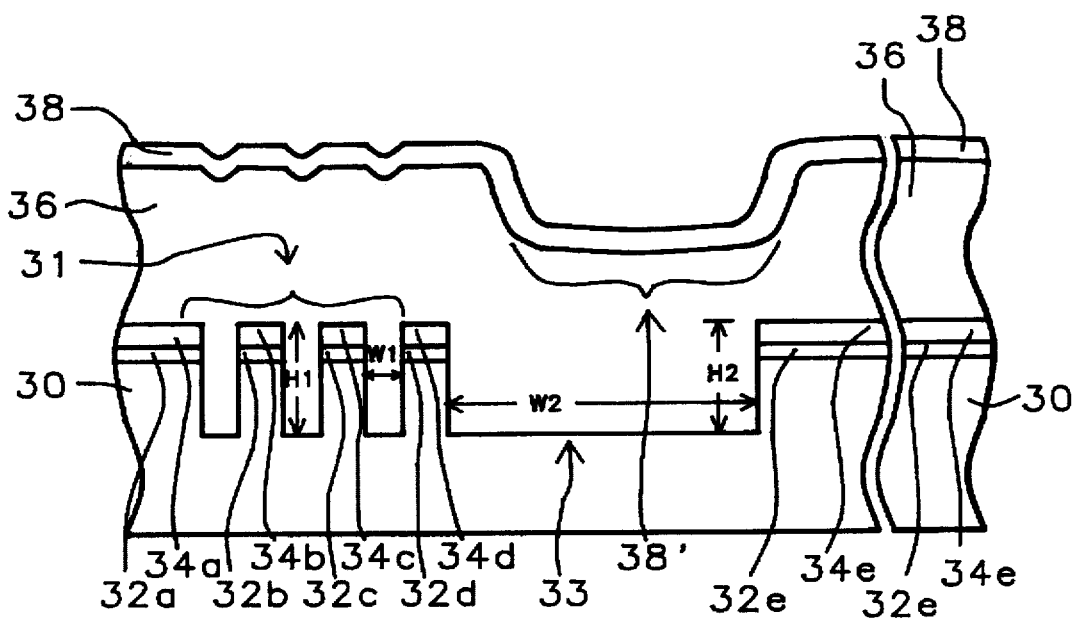
FIG. 3 to FIG. 7 show a series of schematic cross-sectional diagrams illustrating the results of progressive stages in forming, while avoiding dishing, a planarized trench fill dielectric layer within an isolation trench within a semiconductor substrate through a chemical mechanical polish (CMP) planarizing method in accord with a first preferred embodiment of the method of the present invention.

The present invention provides a chemical mechanical polish (CMP) planarizing method for forming, while avoiding dishing, a planarized aperture fill layer within an aperture within a substrate employed within integrated circuit fabrication. The method of the present invention achieves this goal through planarizing through a first chemical mechanical polish (CMP) planarizing method a conformal aperture fill layer formed over the substrate and into the aperture, where the conformal aperture fill layer is formed to a thickness greater than the height of the aperture and where the conformal aperture fill layer has a conformal polish stop layer formed thereupon. The conformal polish stop layer has a lower planar region of the conformal polish stop layer where the conformal aperture fill layer is formed into the aperture. The conformal polish stop layer and the conformal aperture fill layer are polished through the first chemical mechanical polish (CMP) planarizing method until there is reached the lower planar region of the conformal polish stop layer, thus forming a patterned polish stop layer and a partially chemical mechanical polish (CMP) planarized aperture fill layer. The patterned polish stop layer is then employed as an etch mask in forming from the partially chemical mechanical polish (CMP) planarized aperture fill layer an etched partially chemical mechanical polish (CMP) planarized aperture fill layer with a protrusion over the aperture, the protrusion having a height sufficient such that there is avoided dishing within a planarized aperture fill layer formed within the aperture when the etched partially chemical mechanical polish (CMP) planarized aperture fill layer is planarized through a second chemical mechanical polish (CMP) planarizing method to form the planarized aperture fill layer within the aperture. The etched partially chemical mechanical polish (CMP) planarized aperture fill layer is then planarized through the second chemical mechanical polish (CMP) planarizing method to form, while avoiding dishing, the planarized aperture fill layer within the aperture.

Although the preferred embodiments of the method of the present invention disclose the method of the present invention employed in forming, while avoiding dishing: (1) a planarized trench fill dielectric layer within an isolation trench withing a semiconductor substrate employed in integrated circuit fabrication; (2) a planarized inter-metal dielectric (IMD) layer formed separating adjoining patterned conductor layers within an integrated circuit; or (3) a planarized passivation formed over multiple patterned conductor layers within an integrated circuit, the method of the present invention may also be employed in forming, while avoiding dishing, other planarized aperture fill layers within other apertures within substrates other than those employed within integrated circuit fabrication. The method of the present invention may be employed in forming, while avoiding dishing and while simultaneously avoiding formation of planarized aperture fill residue layers upon portions of substrates adjoining apertures, planarized aperture fill layers including but not limited to planarized aperture fill dielectric layers, planarized aperture fill semiconductor layers and planarized aperture fill conductor layers within apertures of various types within substrates including but not limited to dielectric substrates, semiconductor substrates and conductor substrates. When employed in forming planarized aperture fill dielectric layers upon substrates employed within integrated circuit fabrication, the method of the present invention may be employed in forming planarized aperture fill dielectric layers within apertures within various locations within integrated circuits. The method of the present invention may be employed in forming within integrated circuits planarized aperture fill dielectric layers in locations within integrated circuits which provide planarized aperture fill dielectric layers including but not limited to planarized trench fill dielectric layers, planarized pre-metal dielectric (PMD) layers, planarized inter-metal dielectric (IMD) layers, planarized inter-level dielectric (ILD) layers and planarized passivation layers.

For a general application of the method of the present invention, the width of the aperture into which is formed the aperture fill layer is typically greater than about 3 microns, the depth of the aperture into which is filled the aperture fill layer is preferably from about 3000 to about 7000 angstroms, the thickness of the aperture fill layer is preferably from about 7000 to about 9000 angstroms and the thickness of the conformal polish stop layer is preferably from about 2000 to about 4000 angstroms.

First Preferred Embodiment

Referring now to FIG. 3 to FIG. 7, there is shown a series of schematic cross-sectional diagrams illustrating the results of progressive stages in forming while avoiding dishing and while simultaneously avoiding formation of planarized trench fill dielectric residue layers, a planarized trench fill dielectric layer within an isolation trench within a semiconductor substrate in accord with a first preferred embodiment of the method of the present invention. Shown in FIG. 3 is a schematic cross-sectional diagram illustrating the semiconductor substrate at an early stage in practice of the first preferred embodiment of the method of the present invention.

Shown in FIG. 3 is a semiconductor substrate 30 having formed therein a series of narrow trenches 31 and a wide trench 33. Although the first preferred embodiment of the method of the present invention may be practiced employing semiconductor substrates of either dopant polarity, any dopant concentration and any crystallographic orientation, within the first preferred embodiment of the method of the present invention the semiconductor substrate 30 is preferably a (100) silicon semiconductor substrate having an N- or P- doping. As is illustrated in FIG. 3, each of the narrow trenches within the series of narrow trenches 31 has a width W1 and a height H1, where the width W1 is preferably from about 0.25 to about 0.5 microns while the height H1 is preferably from about 5000 to about 7000 angstroms. Similarly, as is also illustrated in FIG. 3, the wide trench 33 has a width W2 and a height H2, where the width W2 is typically wider than about 3 microns and the height H2 is preferably from about 5000 to about 7000 angstroms.

Formed upon the semiconductor substrate 30 and defining the series of narrow trenches 31 and the wide trench 33 is a series of patterned pad oxide layers 32a, 32b, 32c, 32d and 32e having formed and aligned thereupon a series of patterned silicon nitride layers 34a, 34b, 34c, 34d and 34e. Within the first preferred embodiment of the method of the present invention, the series of patterned silicon nitride layers 34a, 34b, 34c, 34d and 34e serves as a series of patterned first polish stop layers, while the series of patterned pad oxide layers 32a, 32b, 32c, 32d and 32e serves as adhesive forming and stress reducing layers between the semiconductor substrate 30 and the series of patterned silicon nitride layers 34a, 34b, 34c, 34d and 34e. While the series of patterned pad oxide layers 32a, 32b, 32c, 32d and 32e, and the series of patterned silicon nitride layers 34a, 34b, 34c, 34d and 34e, are preferably employed within the first preferred embodiment of the method of the present invention, they are not required within the method of the present invention. However, their presence provides a means for most uniformly forming within the series of narrow trenches 31 and the wide trench 33 planarized trench fill dielectric layers through the first preferred embodiment of the method of the present invention. Both the patterned pad oxide layers 32a, 32b, 32c, 32d and 32e, and the patterned silicon nitride layers 34a, 34b, 34c, 34d and 34e, may be formed through methods as are conventional in the art, which will typically, although not exclusively, employ photolithographic patterning of a corresponding blanket silicon nitride layer formed upon a corresponding blanket pad oxide layer. The blanket silicon nitride layer and the blanket pad oxide layer may be formed through methods as are conventional in the art, including but not limited to thermal oxidation methods, chemical vapor deposition (CVD)) methods and physical vapor deposition (PVD) sputtering methods. Preferably, the patterned pad oxide layers 32a, 32b, 32c, 32d and 32e, and the corresponding blanket pad oxide layer, are from about 90 to about 130 angstroms thick each. Preferably, the patterned silicon nitride layers 34a, 34b, 34c, 34d and 34e, and the corresponding blanket silicon nitride layer, are from about 1500 to about 2000 angstroms thick each.

There is also shown in FIG. 3 formed over the semiconductor substrate 30 and into the series of narrow trenches 31 and the wide trench 33 a conformal trench fill dielectric layer 36. Although any of several trench fill dielectric materials may be employed in forming within the first preferred embodiment of the method of the present invention the conformal trench fill dielectric layer 36, the first preferred embodiment of the method of the present invention provides value when the trench fill dielectric material from which is formed the conformal trench fill dielectric layer 36 is readily planarized through a chemical mechanical polish (CMP) planarizing method while employing the patterned silicon nitride layers 34a, 34b, 34c, 34d and 34e as patterned first polish stop layers. Thus, although the use of other materials is not excluded when forming the conformal trench fill dielectric layer 36, the conformal trench fill dielectric layer 36 is preferably formed of a silicon oxide trench fill dielectric material formed through a thermal (i.e.: non-plasma) chemical vapor deposition (CVD) method, as is common in the art. Silicon source materials such as but not limited to silane and tetra-ethyl-ortho-silicate (TEOS) may be employed in forming the conformal trench fill dielectric layer 36 through the thermal chemical vapor deposition (CVD) method. For the first preferred embodiment of the method of the present invention, the conformal trench fill dielectric layer 36 is formed over the semiconductor substrate 30 and into the series of narrow trenches 31 and the wide trench 33 to a thickness greater than the depth H2 of the wide trench 33. Thus, the thickness of the conformal trench fill dielectric layer 36 is preferably from about 7000 to about 9000 angstroms.

Although not specifically illustrated by the schematic cross-sectional diagram of FIG. 3, it is also typical and preferred within the first preferred embodiment of the method of the present invention to form through a thermal oxidation method a series of thermally grown silicon oxide trench liner layers upon the sidewalls and the bottoms of the series narrow trenches 31 and the wide trench 33. Such thermally grown silicon oxide trench liner layers typically provide superior isolation between the semiconductor substrate 30 and planarized trench fill dielectric layers subsequently formed from the conformal trench fall dielectric layer 36.

Finally, there is shown in FIG. 3 a conformal second polish stop layer 38 formed upon the conformal trench fill dielectric layer 36. Although other materials of sufficient hardness may also be employed in forming the conformal second polish stop layer 38, the conformal second polish stop layer 38 within the first preferred embodiment of the method of the present invention is also preferably formed of a silicon nitride material formed through a method analogous or equivalent to the method employed in forming the patterned silicon nitride layers 34a, 34b, 34c, 34d and 34e. Preferably, the conformal second polish stop layer 38 of silicon nitride so formed has a thickness of from about 2000 to about 4000 angstroms. As is illustrated in FIG. 3, the conformal second polish stop layer 38 has a lower planar region 38' of the conformal second polish stop layer 38 where the conformal trench fill dielectric layer 36 is formed into the wide trench 33. Due to the width W1 of each narrow trench within the series of narrow trenches 31, in conjunction with the thickness of the conformal trench fill dielectric layer 36, the conformal second polish stop layer 38 is substantially planar over the series of narrow trenches 31.

Figure 4:
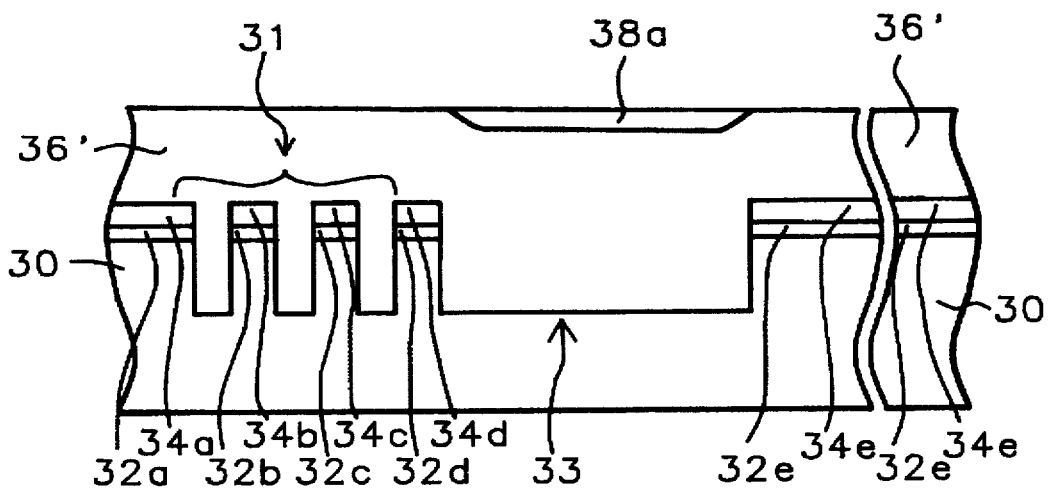

Referring now to FIG. 4, there is shown a schematic cross-sectional diagram illustrating the results of further processing of the semiconductor substrate 30 whose schematic cross-sectional diagram is illustrated in FIG. 3. Shown in FIG. 4 is the results of planarizing through a first chemical mechanical polish (CMP) planarizing method the conformal second polish stop layer 38 and the conformal trench fill dielectric layer 36. The conformal second polish stop layer 38 and the conformal trench fill dielectric layer 36 are planned until there is reached the lower planar region 38' of the conformal second polish stop layer 38, thus simultaneously forming the patterned second polish stop layer 38a and the partially chemical mechanical polish (CMP) planarized trench fill dielectric layer 36'. As is common, although not exclusive, in the art of chemical mechanical polish (CMP) planarizing of trench fill dielectric layers formed of silicon oxide trench fill dielectric materials within integrated circuits, the first chemical mechanical polish (CMP) planarizing method will typically, although not exclusively, employ a silicon oxide polishing slurry. Under such circumstances, the conformal trench fill dielectric layer 36 of silicon oxide will typically polish at a polish rate ratio of from about 3:1 to about 4:1 with respect to the conformal second polish stop layer 38, when the conformal second polish stop layer 38 is formed of a silicon nitride. Preferably, the first chemical mechanical polish (CMP) planarizing method is employed at: (1) a platen pressure of from about 7 to about 10 pounds per square inch (psi); (2) a rotation speed of from about 20 to about 60 revolutions per minute (rpm); (3) a silicon oxide slurry concentration of at least several percent silicon oxide by weight; and (4) a platen temperature of from about 15 to about 40 degrees centigrade.

Figure 5:
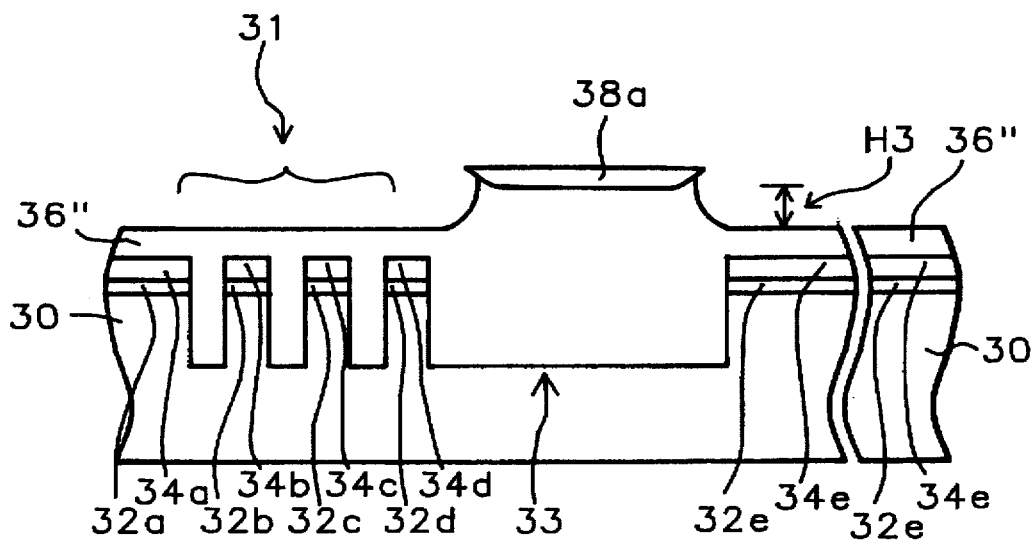

Referring now to FIG. 5, there is shown a schematic cross-sectional diagram illustrating the results of further processing of the semiconductor substrate 30 whose schematic cross-sectional diagram is illustrated in FIG. 4. Shown in FIG. 5 is the results of etching, while employing the patterned second polish stop layer 38a as an etch mask layer, the partially chemical mechanical polish (CMP) planarized trench fill dielectric layer 36' to form the etched partially chemical mechanical polish (CMP) planarized trench fill dielectric layer 36". While FIG. 5 illustrates the results of isotropic etching when forming the etched partially chemical mechanical polish (CMP) planarized trench fill dielectric layer 36" (i.e.: there is an undercutting of the etched partially chemical mechanical polish (CMP) planarized trench fill dielectric layer 36" beneath the patterned second polish stop layer 38a), the method of the present invention will also provide nominally equivalent results when there is alternatively employed an anisotropic etching in forming the etched partially chemical mechanical polish (CMP) planarized trench fill dielectric layer 36" (i.e.: limited undercutting and more vertical profile of the etched partially chemical mechanical polish (CMP) planarized trench fill dielectric layer 36" beneath the patterned second polish stop layer 38a). When employing an isotropic etching method in forming the etched partially chemical mechanical polish (CMP) planarized trench fill dielectric layer 36", there is typically and preferably employed an aqueous hydrofluoric acid etchant or a buffered oxide etchant (BOE) (i.e.: aqueous ammonium fluoride and hydrofluoric acid solution). When employing an anisotropic etching method in forming the etched partially chemical mechanical polish (CMP) planarized trench fill dielectric layer 36", there is typically and preferably employed a reactive ion etch (RIE) method employing a fluorine containing etchant gas composition. As is illustrated in FIG. 5, the etched partially chemical mechanical polish (CMP) planarized trench fill dielectric layer 36" is formed with a protrusion of height H3 over the wide trench 33 in comparison with other regions of the semiconductor substrate 30. Within the context of the first preferred embodiment of the method of the present invention the height H3 of the protrusion is preferably from about 1000 to about 3000 angstroms. The height H3 of the protrusion over the wide trench 33 is adjusted within the context of the thickness of the etched partially chemical mechanical polish (CMP) planarized trench fill dielectric layer 36" over regions of the semiconductor substrate 30 other than those over the wide trench 33, such that when planarizing the etched partially chemical mechanical polish (CMP) planarized trench fill dielectric layer 36" through a second chemical mechanical polish (CMP) planarizing method there is formed, while avoiding dishing and while avoiding forming planarized trench fill dielectric residue layers over portions of the semiconductor substrate 30 adjoining the wide trench 33, a planarized trench fill dielectric layer within the wide trench 33.

Figure 6:
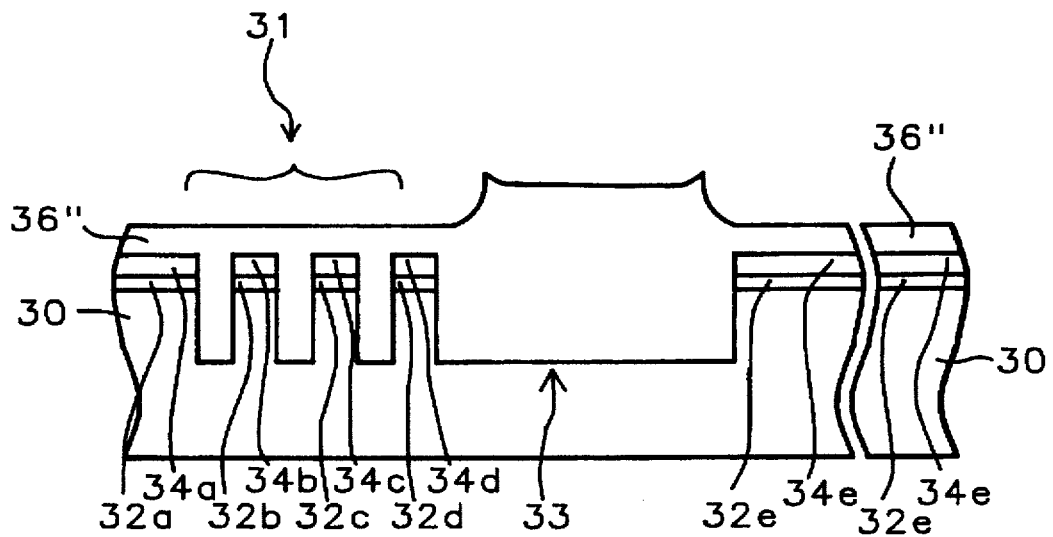

Referring now to FIG. 6, there is shown a schematic cross-sectional diagram illustrating the results of further processing of the semiconductor substrate 30 whose schematic cross-sectional diagram is illustrated in FIG. 5. Shown in FIG. 6 is a schematic cross-sectional diagram of the semiconductor substrate 30 otherwise equivalent to the schematic cross-sectional diagram of the semiconductor substrate 30 as illustrated in FIG. 5, but from whose surface has been removed the patterned second polish stop layer 38a. Although it is not essential within the first preferred embodiment of the method of the present invention that the patterned second polish stop layer 38a is removed from the surface of the etched partially chemical mechanical polish (CMP) planarized trench fill dielectric layer 36", it is preferred that the patterned second polish stop layer 38a is removed from the surface of the etched partially chemical mechanical polish (CMP) planarized trench fill dielectric layer 36", since there is then provided enhanced process latitude within the method of the present invention in forming planarized trench fill dielectric layers from the etched partially chemical mechanical polish (CMP) planarized trench fill dielectric layer 36". The patterned polish stop layer 38a may be removed from the etched partially chemical mechanical polish (CMP) planarized trench fill dielectric layer 36' through methods as are conventional in the art, which methods will typically, although not exclusively, include wet chemical stripping in refluxing phosphoric acid.

Figure 7:
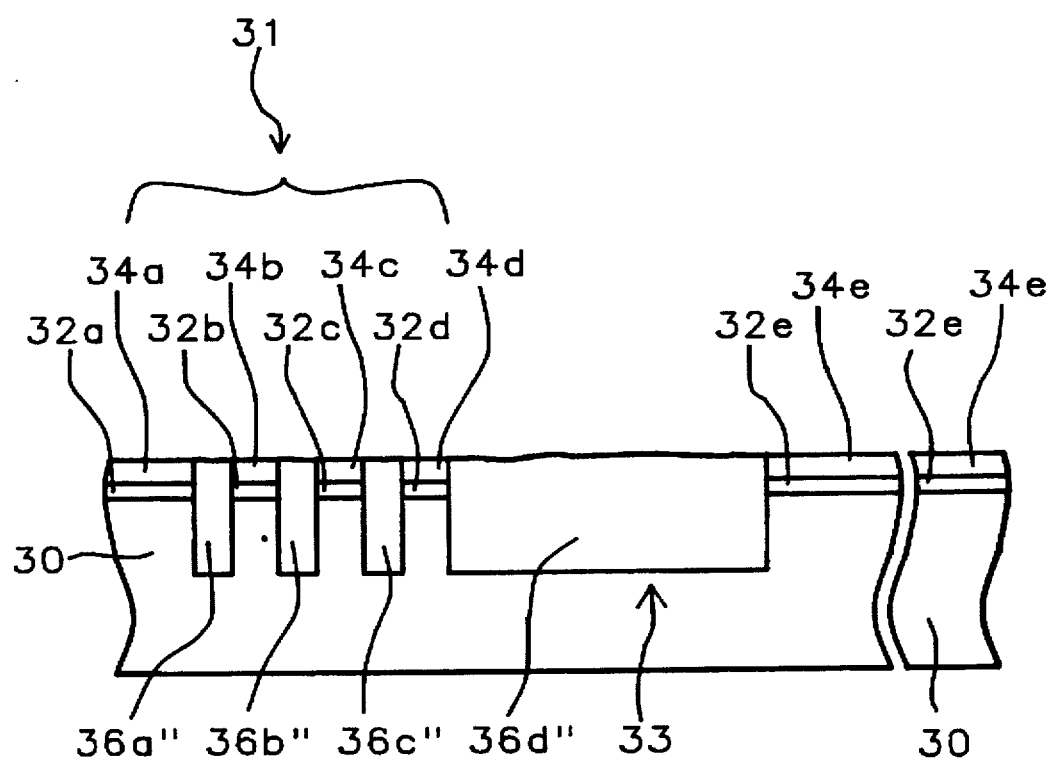

Referring now to FIG. 7, there is shown a schematic cross-sectional diagram illustrating the results of further processing of the semiconductor substrate 30 whose schematic cross-sectional diagram is illustrated in FIG. 6. Shown in FIG. 7 is the results of planarizing through a second chemical polish (CMP) planarizing method the etched partially chemical mechanical polish (CMP) planarized trench fill dielectric layer 36" to form the planarizing trench fill dielectric layers 36a", 36b", 36c" and 36d". The methods and materials employed within the second chemical mechanical polish (CMP) planarizing method are preferably analogous or equivalent to the methods and materials employed within the first chemical mechanical polish (CMP) planarizing method.

As is illustrated by the schematic cross-sectional diagram of FIG. 7, there is avoided through the first preferred embodiment of the method of the present invention dishing of the planarized trench fill dielectric layer 36d" formed within the wide trench 33. Dishing is avoided by means of the protrusion of height H3 within the etched partially chemical mechanical polish (CMP) planarized trench fill dielectric layer 36" over the wide trench 33. The protrusion of height H3 compensates for differences in chemical mechanical polish (CMP) planarizing rates of the etched partially chemical mechanical polish (CMP) planarized trench fill dielectric layer 36" over the wide trench 33 in comparison with other regions of the semiconductor substrate 30. Similarly, there is also avoided through the first preferred embodiment of the method of the present invention the formation of planarized trench fill residue layers over portions of the semiconductor substrate 30 adjoining the wide trench 33. The formation of trench fill residue layers over portions of the semiconductor substrate 30 adjoining the wide trench 33 is similarly avoided through means of the protrusion of height H3 within etched partially chemical mechanical polish (CMP) planarized trench fill dielectric layer 36" over the wide trench 33 since the protrusion of height H3 compensates for differences in chemical mechanical polish (CMP) planarizing rates of the etched partially chemical mechanical polish (CMP) planarized trench fill dielectric layer 36" over the wide trench 33 in comparison with other regions of the semiconductor substrate 30.

Second Preferred Embodiment

Figure 8:
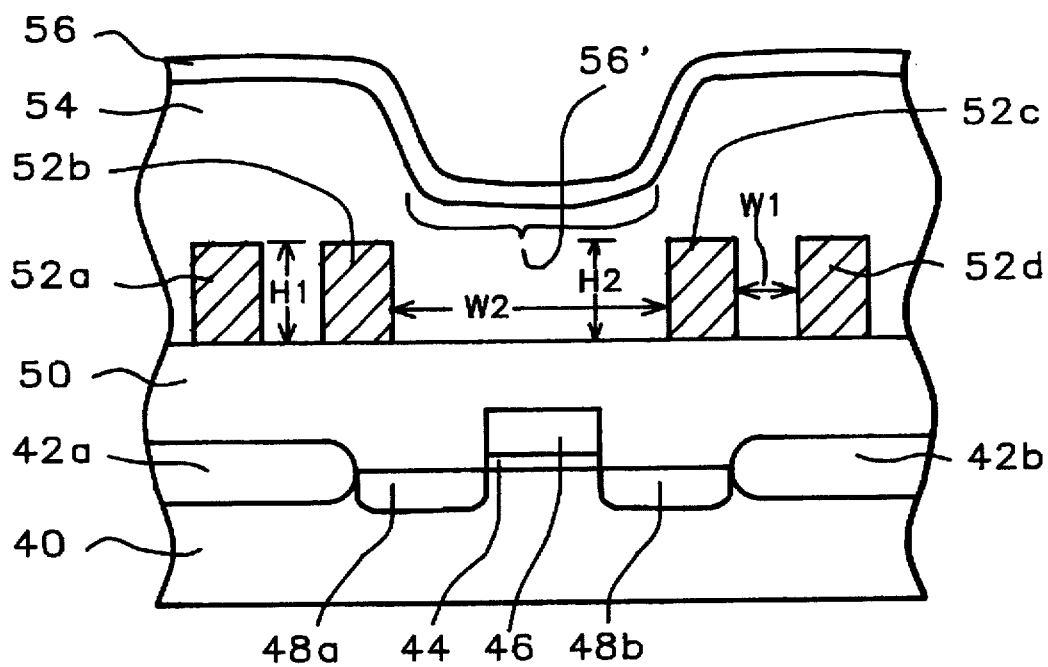
FIG. 8 to FIG. 11 show a series of schematic cross-sectional diagrams illustrating the results of progressive stages in forming, while avoiding dishing, a planarized inter-metal dielectric (IMD) layer separating a series of patterned conductor layers formed within an integrated circuit, the planarized inter-metal dielectric (IMD) layer being formed through a chemical mechanical polish (CMP) planarizing method in accord with a second preferred embodiment of the method of the present invention.

Referring now to FIG. 8 to FIG. 11 there is shown a series of schematic cross-sectional diagrams illustrating the results of progressive stages in forming within an integrated circuit, while avoiding dishing, a series of planarized inter-metal dielectric (IMD) layers separating a series of patterned conductor layers, the series of planarized inter-metal dielectric (IMD) layers being formed through a chemical mechanical polish (CMP) planarizing method in accord with a second preferred embodiment of the method of the present invention. Shown in FIG. 8 is a schematic cross-sectional diagram of the integrated circuit at an early stage in its fabrication.

Shown in FIG. 8 is a semiconductor substrate 40 having formed within and upon its surface a pair of isolation regions 42a and 42b which define an active region of the semiconductor substrate 40. Analogously with the first preferred embodiment of the method of the present invention, while the semiconductor substrate 40 may have either dopant polarity, any dopant concentration and various crystallographic orientations, the semiconductor substrate 40 within the second preferred embodiment of the method of the present invention is preferably a (100) silicon semiconductor substrate having an N- or P- doping. Similarly, although it is also known in the art that isolation regions may be formed within and/or upon semiconductor substrates through methods including but not limited to isolation region growth methods and isolation region deposition/patterning methods, for the second preferred embodiment of the method of the present invention the isolation regions 42a and 42b are preferably formed within and upon the semiconductor substrate 40 through an isolation region thereat oxidation method which provides isolation regions 42a and 42b of silicon oxide formed within and upon the semiconductor substrate 40.

Also shown within FIG. 8, within or upon the active region of the semiconductor substrate 40 are several structures which comprise a field effect transistor (FET). The structures include: (1) a gate dielectric layer 44 formed upon the active region of the semiconductor substrate 40; (2) a gate electrode 46 formed and aligned upon the gate dielectric layer 44; and (3) a pair of source/drain regions 48a and 48b formed into the active region of the semiconductor substrate 40 at areas not covered by the gate dielectric layer 44 and the gate electrode 46. Each of the foregoing structures comprising the field effect transistor (FET) may be formed through methods as are conventional in the art of field effect transistor (FET) fabrication.

Typically and preferably, the gate dielectric layer 44 is formed through patterning, through methods as are conventional in the art, of a blanket gate dielectric layer formed upon the active region of the semiconductor substrate at a thickness of from about 30 to about 150 angstroms. Similarly, the gate electrode is typically and preferably formed through patterning, through methods as are conventional in the art, of a blanket gate electrode material layer (typically formed of a highly doped polysilicon or a polycide) formed upon the blanket gate dielectric layer at a thickness of from about 1500 to about 3500 angstroms. Finally, the source/drain regions 48a and 48b are typically and preferably formed within the active region of the semiconductor substrate 40 through ion implanting a suitable dopant ion into the active region of the semiconductor substrate 40, while employing the gate dielectric layer 44 and the gate electrode 46 as a mask, at an ion implantation dose of from about 1E14 to about 1E16 ions per square centimeter and an ion implantation energy of from about 50 to about 150 keV.

There is also shown in FIG. 8 the presence of a planarized pre-metal dielectric (PMD) layer 50 formed over the semiconductor substrate 40 including the structures comprising the field effect transistor (FET). Methods and materials through which planarized pre-metal dielectric (PMD) layers may be formed within integrated circuits are known in the art of integrated circuit fabrication. Planarized pre-metal dielectric (PMD) layers are typically, although not exclusively, formed within integrated circuits through planarizing through methods as are conventional in the art of conformal pre-metal dielectric (PMD) layers formed within integrated circuits. Conformal pre-metal dielectric (PMD) layers may be formed within integrated circuits through methods including but not limited to chemical vapor deposition (CVD) methods, plasma enhanced chemical vapor deposition (PECVD) methods and physical vapor deposition (PVD) sputtering methods through which may be formed conformal pre-metal dielectric (PMD) layers of dielectric materials including but not limited to silicon oxide dielectric materials, silicon nitride dielectric materials and silicon oxynitride dielectric materials. For the second preferred embodiment of the method of the present invention, the planarized pre-metal dielectric (PMD) layer 50 is preferably: (1) formed from a conformal pre-metal dielectric (PMD) layer formed from a silicon oxide dielectric material formed through a plasma enhanced chemical vapor deposition (PECVD) method; and (2) planarized through a chemical mechanical polish (CMP) planarizing method or reactive ion etch (RIE) etchback planarizing method, as is similarly conventional in the art of integrated circuit fabrication. Typically and preferably, the planarized pre-metal dielectric (PMD) layer 50 has a thickness of from about 10000 to about 20000 angstroms.

Also shown in FIG. 8, formed upon the planarized pre-metal dielectric (PMD) layer 50 is a series of patterned first conductor layers 52a, 52b, 52c and 52d. As is conventional in the art of integrated circuit fabrication, the series of patterned first conductor layers 52a, 52b, 52c and 52d is preferably formed through patterning methods as are conventional in the art of a blanket first conductor layer. Although the blanket first conductor layer may be formed from any of several conductor materials, including but not limited to metals, metal alloys, highly doped polysilicon and polycides, for the second preferred embodiment of the present invention, the blanket first conductor layer is preferably formed at least in part of an aluminum containing conductor material. Typically and preferably, the blanket first conductor layer is formed to a thickness of from about 5000 to about 7000 angstroms, thus yielding patterned first conductor layers 52a, 52b, 52c and 52d of height H2 nominally equivalent to the depth H2 of the series of narrow trenches 31 and the wide trench 33 within the semiconductor substrate 30 within the first preferred embodiment of the method of the present invention. Also analogously with the first preferred embodiment of the method the present invention, each aperture within a pair of first apertures formed between the patterned first conductor layers 52a and 52b, and the patterned first conductor layers 52c and 52d, has a width W1 analogous or equivalent to the width W1 of each of the narrow trenches within the series of narrow trenches 31 within the semiconductor substrate 30 within the first preferred embodiment of the method of the present invention, while the patterned first conductor layers 52b and 52c are separated by a second aperture of width W2 analogous or equivalent to the width W2 of the wide trench 33 within the semiconductor substrate 30 within the first preferred embodiment of the method of the present invention. Thus, the planarized pre-metal dielectric (PMD) layer 50 and the patterned first conductor layers 52a, 52b, 52c and 52d provide a topography to the surface to the semiconductor substrate 40 within the second preferred embodiment of the method of the present invention analogous or equivalent to the topography of the surface of the semiconductor substrate 30 within the first preferred embodiment of the method of the present invention.

Finally, there is shown in FIG. 8 the presence of: (1) a conformal inter-metal dielectric (IMD) layer 54 formed upon the patterned first conductor layers 52a, 52b, 52c and 52d, and the portions of the planarized pre-metal dielectric layer 50 exposed through the patterned first conductor layers 52a, 52b, 52c and 52d; and (2) a conformal polish stop layer 56 formed upon the conformal inter-metal dielectric (IMD) layer 54, where the conformal polish stop layer 56 has a lower planar region 56' of the conformal polish stop layer 56 where the conformal polish stop layer 56 is formed into an aperture within the conformal inter-metal dielectric (IMD) layer 54 at the location of the second aperture defined by the patterned first conductor layers 52b and 52c. The conformal inter-metal dielectric (IMD) layer 54 is preferably formed through methods, materials and dimensions analogous or equivalent to the methods, materials and dimensions employed in forming the conformal trench fill dielectric layer 36 within the first preferred embodiment of the method of the present invention. Similarly, the conformal polish stop layer 56 is preferably formed through methods, materials and dimensions analogous or equivalent to the methods, materials and dimensions employed in forming the conformal second polish stop layer 38 within the first preferred embodiment of the method of the present invention.

Figure 9:
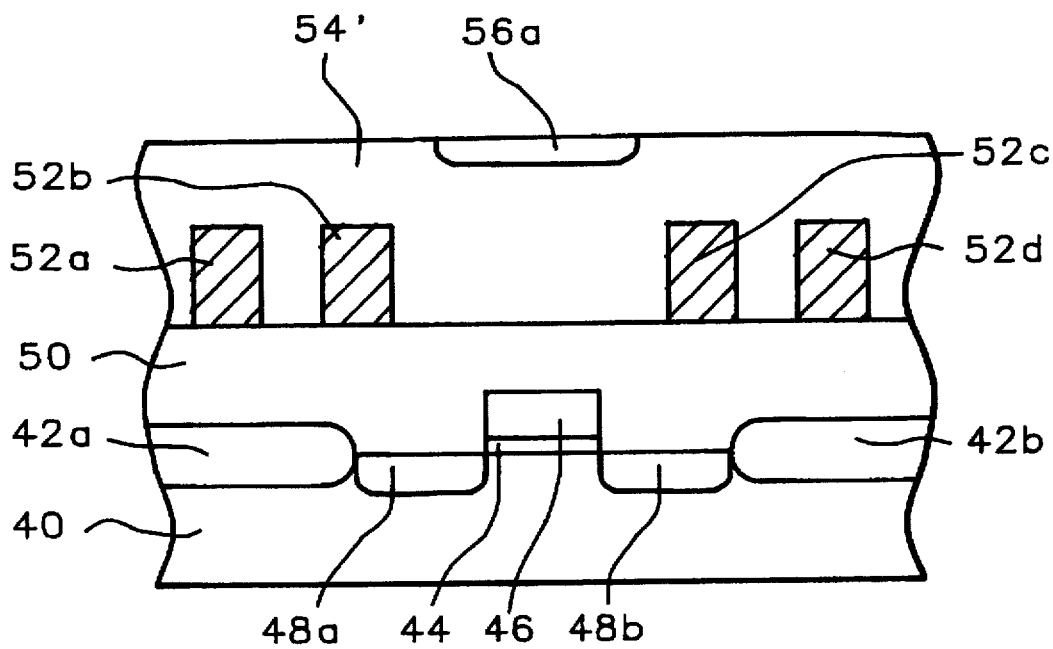

Referring now to FIG. 9, there is shown a schematic cross-sectional diagram illustrating the results of further processing of the integrated circuit whose schematic cross-sectional diagram is illustrated in FIG. 8. Shown in FIG. 9 is the results of planarizing, through a first chemical mechanical polish (CMP) planarizing method, the conformal polish stop layer 56 and the conformal inter-metal dielectric (IMD) layer 54. The conformal polish stop layer 56 and the conformal inter-metal dielectric (IMD) layer 54 are planarized until there is reached the lower planar region 56' of the conformal polish stop layer 56, thus forming the partially chemical mechanical polish (CMP) planarized inter-metal dielectric (IMD) layer 54' and the patterned polish stop layer 56a. The first chemical mechanical polish (CMP) planarizing method preferably employs methods and materials analogous or equivalent to the methods and materials employed within the first chemical mechanical polish (CMP) planarizing method employed within the first preferred embodiment of the method of the present invention.

Figure 10:
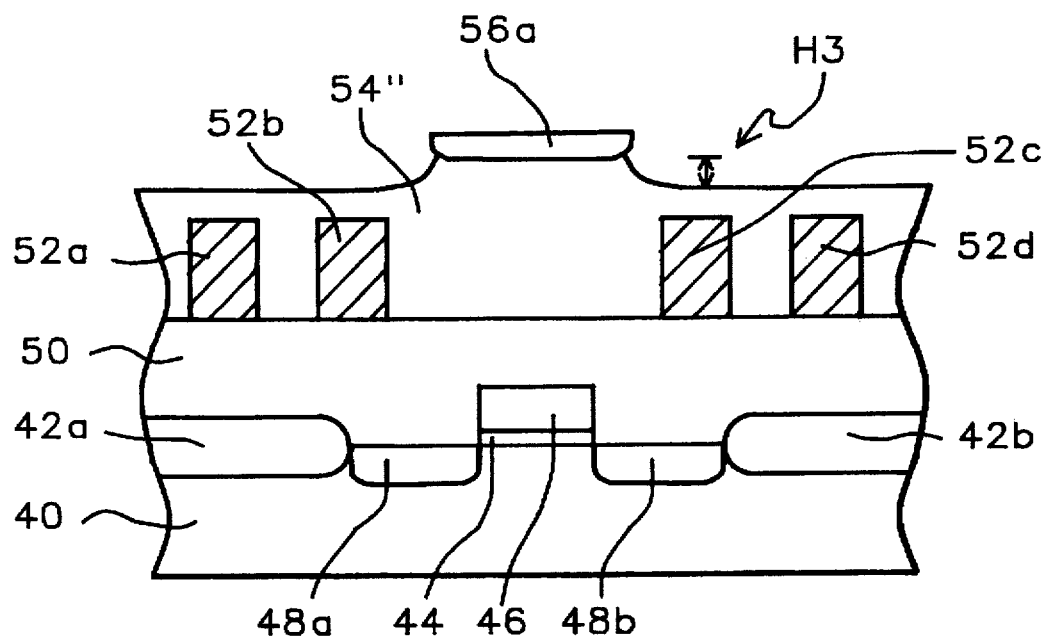

Referring now to FIG. 10, there is shown a schematic cross-sectional diagram illustrating the results of further processing of the integrated circuit whose schematic cross-sectional diagram is illustrated in FIG. 9. Shown in FIG. 10 is the results of etching while employing the patterned polish stop layer 56a as an etch mask layer, the partially chemical mechanical polish (CMP) planarized inter-metal dielectric (IMD) layer 54' to form the etched partially chemical mechanical polish (CMP) planarized inter-metal dielectric (IMD) layer 54" having a protrusion of height H3 over the second aperture with respect to other regions of the semiconductor substrate 40. The partially chemical mechanical polish (CMP) planarized inter-metal dielectric (IMD) layer 54' is etched to form the etched partially chemical mechanical polish (CMP) planarized inter-metal dielectric (IMD) layer 54" through methods and materials analogous or equivalent to the methods and materials employed in etching the partially chemical mechanical polish (CMP) planarized trench fill dielectric layer 36' to form the etched partially chemical mechanical polish (CMP) planarized trench fill dielectric layer 36" within the first preferred embodiment of the method of the present invention. Similarly, the protrusion of height H3 within the etched partially chemical mechanical polish (CMP) planarized inter-metal dielectric (IMD) layer 54" is formed of analogous or equivalent dimensions to the protrusion of height H3 within the etched partially chemical mechanical polish (CMP) planarized trench fill dielectric layer 36" within the first preferred embodiment of the method of the present invention.

Figure 11:
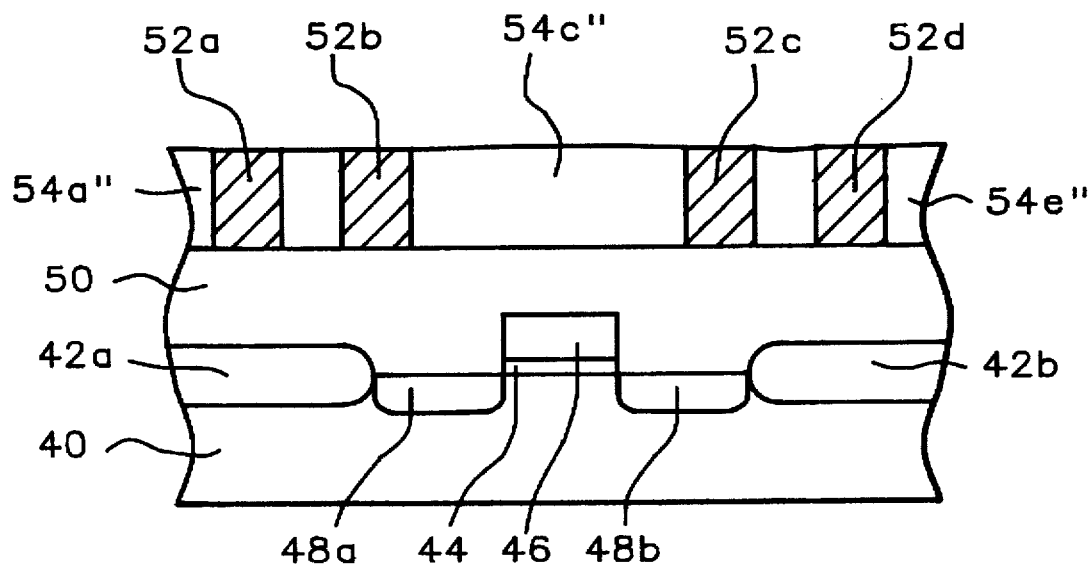

Referring now to FIG. 11, there is shown a schematic cross-sectional diagram illustrating the results of further processing of the integrated circuit whose schematic cross-sectional diagram is illustrated in FIG. 10. Shown in FIG. 11 is the results of stripping the patterned conformal polish stop layer 56a from the etched partially chemical mechanical polish (CMP) planarized inter-metal dielectric (IMD) layer 54" and subsequently planarizing through a second chemical mechanical polish (CMP) planarizing method the etched partially chemical mechanical polish (CMP) planarized inter-metal dielectric (IMD) layer 54" to form the planarized inter-metal dielectric (IMD) layers 54a41, 54b", 54c", 54d' and 54e". The patterned polish stop layer 56a is preferably stripped through methods and materials analogous or equivalent to the methods and materials employed in stripping the patterned second polish stop layer 38a within the first preferred embodiment of the method of the present invention. Preferably, the second chemical mechanical polish (CMP) planarizing method employs methods and materials analogous or equivalent to the methods and materials employed within the second chemical mechanical polish (CMP) planarizing method employed in forming the planarized trench fill dielectric layers 36a", 36b", 36c" and 36d" within the first preferred embodiment of the method of the present invention.

As is illustrated by FIG. 11, the planarized inter-metal dielectric (IMD) layer 54c" is formed while avoiding dishing since the protrusion of height H3 within the etched partially chemical mechanical polish (CMP) planarized inter-metal dielectric (IMD) layer 54" above the second aperture compensates for a more rapid chemical mechanical polish (CMP) planarizing rate of the etched partially chemical mechanical polish (CMP) planarized inter-metal dielectric (IMD) layer 54" over the second aperture. Similarly, although not specifically illustrated in FIG. 11, the protrusion of height H3 within the etched partially chemical mechanical polish (CMP) planarized inter-metal dielectric (IMD) layer 54" over the second aperture sufficiently compensates for differences in polish rate of different portions of the etched partially chemical mechanical polish (CMP) planarized inter-metal dielectric (IMD) layer 54" such that etched partially chemical mechanical polish (CMP) planarized inter-metal dielectric (IMD) residue layers are not formed over large islands (not shown) of the patterned first conductor layer adjoining the second aperture. Finally, although also not specifically illustrated by the schematic cross-sectional diagrams of FIG. 8 to FIG. 11, the second preferred embodiment of the method of the present invention may also be employed in forming planarized inter-metal dielectric (IMD) layers separating patterned conductor layers other than patterned first conductor layers within integrated circuits. Such other patterned conductor layers may be patterned second conductor layers, patterned third conductor layers and other patterned upper laying conductor layers within those integrated circuits.

Third Preferred Embodiment

Figure 12:
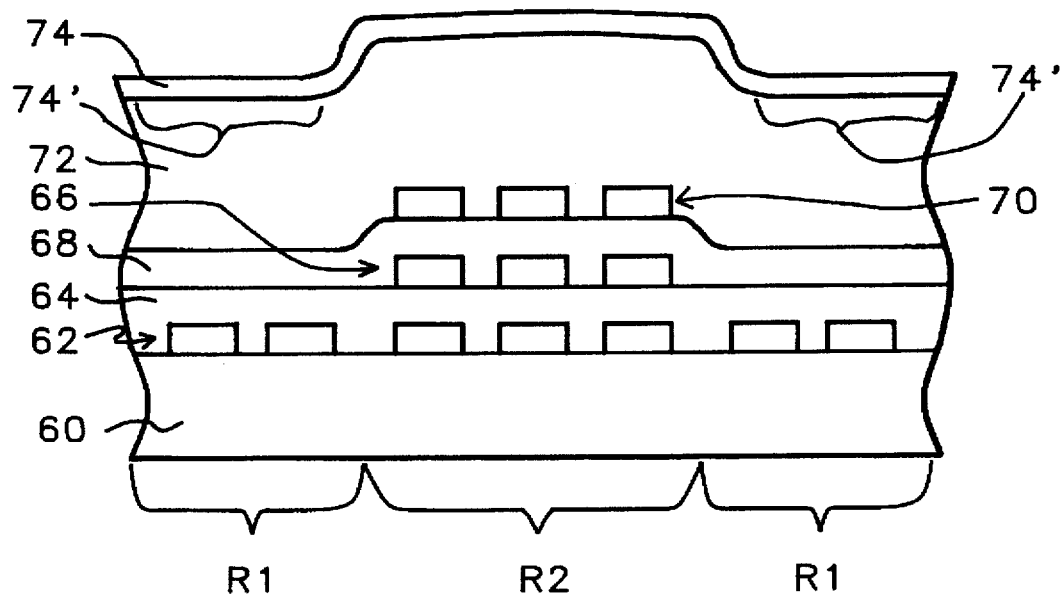
FIG. 12 to FIG. 15 show a series of schematic cross-sectional diagrams illustrating the results of progressive stages in forming, while avoiding dishing, a planarized passivation layer passivating several series of patterned conductor layers within an integrated circuit, the planarized passivation layer being formed in accord with a third preferred embodiment of the method of the present invention.

Referring now to FIG. 12 to FIG. 15, there is shown series of schematic cross-sectional diagrams illustrating the results of progressive stages in forming, while avoiding dishing, a planarized passivation layer passivating several series of patterned conductor layers within an integrated circuit, the planarized passivation layer being formed in accord with a third preferred embodiment of the method of the present invention. Shown in FIG. 12 is a schematic cross-sectional diagram of the integrated circuit at an early stage in its fabrication.

Shown in FIG. 12 is a substrate 60 analogous or equivalent to the semiconductor substrate 40 within the second preferred embodiment of the method of the present invention or the semiconductor substrate 30 within the first preferred embodiment of the method of the present invention. Formed upon the substrate 60 is a series of patterned first conductor layers 62 separated from a series of patterned second conductor layers 66 by a planarized first inter-level dielectric (ILD) layer 64. In turn, the series of patterned second conductor layers 66 is separated from a series of patterned third conductor layers 70 by a conformal second inter-level dielectric (ILD) layer 68. Within FIG. 12, the series of patterned first conductor layers 62, the series of patterned second conductor layers 66 and the series of patterned third conductor layers 70 may be formed from any of several conductor materials as are known in the art, including but not limited to metals, metal alloys, polysilicon and polycide conductor materials. Similarly the planarized first inter-level dielectric (ILD) layer 64 and the conformal second inter-level dielectric (ILD) layer 68 may be formed from any of several dielectric materials as are known in the art, including but not limited to silicon oxide dielectric materials, silicon nitride dielectric materials and silicon oxynitride dielectric materials. Preferably, each of the series of patterned first conductor layers 62, the series of patterned second conductor layers 66 and the series of patterned third conductor layers 70 is formed of patterned polysilicon conductor layers, while each of the planarized first inter-level dielectric (ILD) layer 64 and the conformal inter-level dielectric (ILD) layer 68 is formed of a silicon oxide dielectric material.

As is illustrated in FIG. 12, the substrate 60 is separated into a pair of peripheral regions R1 and a central region R2, where the central region R2 has a higher vertical density of patterned conductor layers than does either of the peripheral regions R1. Thus, due to the lower vertical density of patterned conductor layers in the peripheral regions R1, there is formed an aperture above each peripheral region R1 of the substrate 60 with respect to the central region R2 of the substrate 60. The structure as illustrated in FIG. 12 is common in the art of integrate circuit fabrication, since it is common in the art of integrated circuit fabrication that peripheral regions, such as the peripheral regions R1, will have a lower vertical density of patterned conductor layers employed within structures such as bond pad structures, while central regions, such as the central region R2 will have a higher vertical density of patterned conductor layers to accommodate connections and interconnections among integrated circuit devices (not shown) within active regions of the substrate 60.

Finally, there is shown in FIG. 12: (1) a conformal passivation layer 72 formed upon the series of patterned third conductor layers 70, and the portions of the conformal second inter-level dielectric (ILD) layer 68 exposed through the series of patterned third conductor layers 70; and (2) a conformal polish stop layer 74 formed upon the conformal passivation layer 72. The conformal passivation layer 72 is preferably formed through methods and materials (although not necessarily dimensions) analogous or equivalent to the methods and materials employed in forming the conformal inter-metal dielectric (IMD) layer 54 within the second preferred embodiment of the method of the present invention, while the conformal polish stop layer 74 is similarly preferably formed through methods and materials (although not necessarily dimensions) analogous or equivalent to the methods and materials employed in forming the conformal polish stop layer 56 within the second preferred embodiment of the method of the present invention. As is illustrated in FIG. 12, the conformal polish stop layer 74 has two lower planar regions 74' of the conformal polish stop layer 74 where the conformal polish stop layer 74 is formed into the pair of apertures within the conformal passivation layer 72 over the pair of peripheral regions R1 of the substrate 60.

Figure 13:
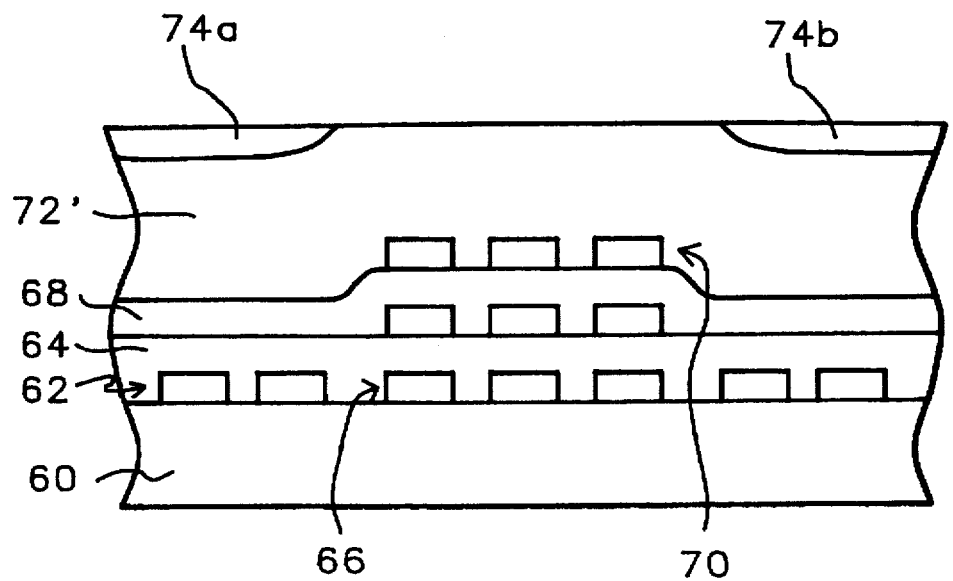

Referring now to FIG. 13, there is shown a schematic cross-sectional diagram illustrating the results of further processing of the integrated circuit whose schematic cross-sectional diagram is illustrated in FIG. 12. Shown in FIG. 13 is the results of planarizing, through a first chemical mechanical polish (CMP) planarizing method, the conformal polish stop layer 74 and the conformal passivation layer 72. The conformal polish stop layer 74 and the conformal passivation 72 are planarized until there is reached the lower planar regions 74' of the conformal polish stop layer 74, thus forming the partially chemical mechanical polish (CMP) planarized passivation layer 72' and the patterned polish stop layers 74a and 74b. The first chemical mechanical polish (CMP) planarizing method preferably employs methods and materials analogous or equivalent to the methods and materials employed within the first chemical mechanical polish (CMP) planarizing method employed within the second preferred embodiment of the method of the present invention.

Figure 14:
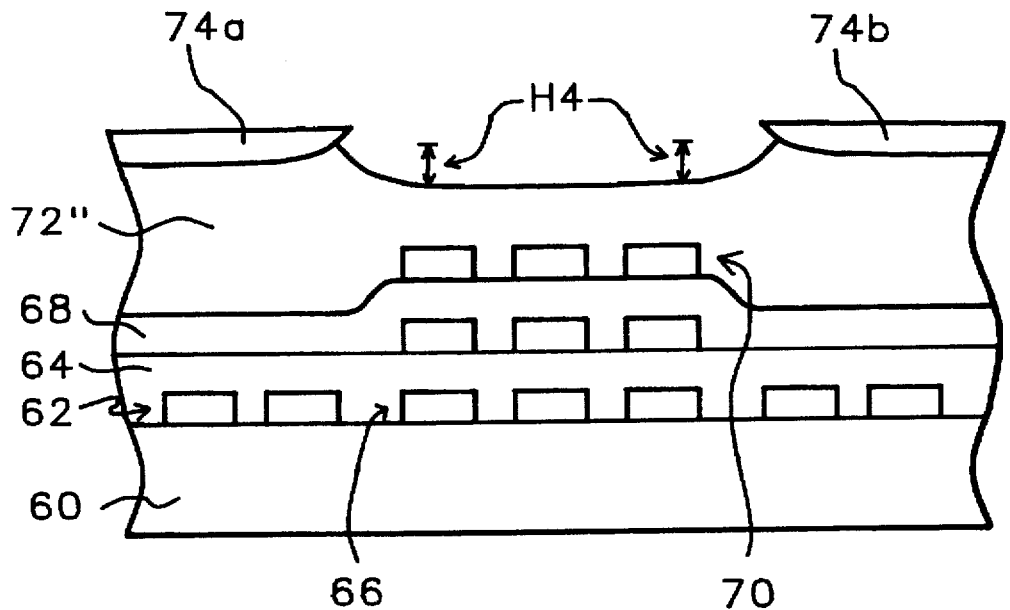

Referring now to FIG. 14, there is shown a schematic cross-sectional diagram illustrating the results of further processing of the integrated circuit whose schematic cross-sectional diagram is illustrated in FIG. 13. Shown in FIG. 14 is the results of etching, while employing the patterned polish stop layers 74a and 74b as etch mask layers the partially chemical mechanical polish (CMP) planarized passivation layer 72' to form the etched partially chemical mechanical polish (CMP) planarized passivation layer 72". The partially chemical mechanical polish (CMP) planarized passivation layer 72' is etched to form the etched partially chemical mechanical polish (CMP) planarized passivation layer 72" through methods and materials analogous or equivalent to the methods and materials employed in etching the partially chemical mechanical polish (CMP) planarized inter-metal dielectric (IMD) layer 54' to form the etched partially chemical mechanical polish (CMP) planarized inter-metal dielectric (IMD) layer 54" within the second preferred embodiment of the method of the present invention. Similarly, the etched partially chemical mechanical polish (CMP) planarized passivation layer 72" has a protrusion of height H4 above each of the apertures over each of the peripheral regions R1 of the substrate 60, where the protrusion of height H4 does not necessarily have an analogous or equivalent height as the protrusion of height H3 within the etched partially chemical mechanical polish (CMP) planarized inter-metal dielectric (IMD) layer 54" within the second preferred embodiment of the method of the present invention.

Figure 15:
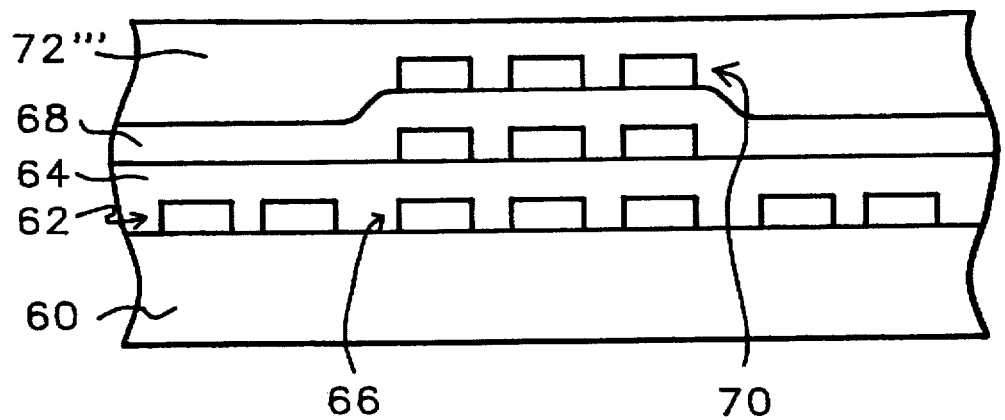

Referring now to FIG. 15, there is shown a schematic cross-sectional diagram illustrating the results of further processing of the integrated circuit whose schematic cross-sectional diagram is illustrated in FIG. 14. Shown in FIG. 15 is the results of stripping the patterned polish stop layers 74a and 74b and subsequently planarizing through a second chemical mechanical polish (CMP) planarizing method the etched partially chemical mechanical polish (CMP) planarized passivation layer 72" to form the planarized passivation layer 72'". The patterned polish stop layers 74a and 74b are is preferably stripped through methods and materials analogous or equivalent to the methods and materials employed in stripping the patterned polish stop layer 56a within the second preferred embodiment of the method of the present invention. Preferably, the second chemical mechanical polish (CMP) planarizing method employs methods and materials analogous or equivalent to the methods and materials employed within the second chemical mechanical polish (CMP) planarizing method employed in forming the planarized inter-metal dielectric (IMD) layers 54a", 54b", 54c", 54d" and 54e" within the second preferred embodiment of the method of the present invention.

As is illustrated by FIG. 11, the planarized passivation 72'" is formed while avoiding dishing over the peripheral regions R1 of the substrate 60 since the protrusions of height H4 of the etched partially chemical mechanical polish (CMP) planarized passivation layer 72" above the peripheral regions R1 of the substrate 60 compensate for a more rapid chemical mechanical polish (CMP) planarizing rate of the etched partially chemical mechanical polish (CHAP) planarized passivation layer 72" over the peripheral regions R1 of the substrate 60. As is illustrated by the schematic cross-sectional diagram of FIG. 15, in comparison with the first preferred embodiment of the method of the present invention and the second preferred embodiment of the method of the present invention, a planarized aperture fill layer formed through the method of the present invention, such as the planarized passivation layer 72'", need not necessarily be patterned while planarized into an aperture within a substrate.

As is understood by a person skilled in the art, the preferred embodiments of the method of the present invention are illustrative of the method of the present invention rather than limiting of the method of the present invention. Revisions and modification may be made to methods, materials, structures and dimensions through which is practiced the preferred embodiments of the method of the present invention while still providing embodiments which are within the spirit and scope of the present invention, as defined by the appended claims.

What is claimed is:

1. A chemical mechanical polish (CMP) method for planarizing a conformal aperture fill layer formed within an aperture within a substrate comprising:

providing a substrate, the substrate having an aperture formed within the substrate;

forming over the substrate and within the aperture a conformal aperture fill layer, the conformal aperture fill layer being formed to a thickness greater than the depth of the aperture;

forming upon the conformal aperture fill layer a conformal polish stop layer, the conformal polish stop layer having a lower planar region of the conformal polish stop layer where the conformal aperture fill layer is formed within the aperture;

planarizing through a first chemical mechanical polish (CMP) planarizing method the conformal polish stop layer and the conformal aperture fill layer until there is reached the lower planar region of the conformal polish stop layer while simultaneously forming a patterned polish stop layer and a partially chemical mechanical polish (CMP) planarized aperture fill layer;

employing the patterned polish stop layer as an etch mask in etching portions of the partially chemical mechanical polish (CMP) planarized aperture fill layer over regions of the substrate other than the aperture to form an etched partially chemical mechanical polish (CMP) planarized aperture fill layer having a protrusion over the aperture, where the height of the protrusion of the etched partially chemical mechanical polish (CMP) planarized aperture fill layer over the aperture compensates for a dish otherwise formed within a planarized aperture fill layer formed within the aperture when forming from the etched partially chemical mechanical polish (CMP) planarized aperture fill layer the planarized aperture fill layer through a second chemical mechanical polish (CMP) method; and employing the second chemical mechanical polish (CMP) method to form from the etched partially chemical mechanical polish (CMP) planarized aperture fill layer the planarized aperture fill layer.

2. The method of claim 1 wherein the substrate is chosen from the group of substrates consisting of insulator substrates, semiconductor substrates and conductor substrates.

3. The method of claim 1 wherein the conformal aperture fill layer is chosen from the group of aperture fill layers consisting of aperture fill insulator layers, aperture fill semiconductor layers and aperture fill conductor layers.

4. The method of claim 1 wherein the width of the aperture is greater that about 3 microns.

5. The method of claim 1 wherein the depth of the aperture is from about 3000 to about 7000 angstroms.

6. The method of claim 5 wherein the thickness of the conformal aperture fill layer is from about 7000 to about 9000 angstroms.

7. The method of claim 1 wherein the thickness of the conformal polish stop layer is from about 2000 to about 4000 angstroms.

8. A chemical mechanical polish (CMP) method for planarizing a conformal trench fill layer formed within a trench within a substrate comprising:

providing a substrate, the substrate having a trench formed within the substrate;

forming over the substrate and within the trench a conformal trench fill layer, the conformal trench fill layer being formed to a thickness greater than the depth of the trench;

forming upon the conformal trench fill layer a conformal polish stop layer, the conformal polish stop layer having a lower planar region of the conformal polish stop layer where the conformal trench fill layer is formed within the trench;

planarizing through a first chemical mechanical polish (CMP) planarizing method the conformal polish stop layer and the conformal trench fill layer until there is reached the lower planar region of the conformal polish stop layer while simultaneously forming a patterned polish stop layer and a partially chemical mechanical polish (CMP) planarized trench fill layer;

employing the patterned polish stop layer as an etch mask in etching portions of the partially chemical mechanical polish (CMP) planarized trench fill layer over regions of the substrate other than the trench to form an etched partially chemical mechanical polish (CMP) planarized trench fill layer having a protrusion over the trench, where the height of the protrusion of the etched partially chemical mechanical polish (CMP) planarized trench fill layer over the trench compensates for a dish otherwise formed within a planarized trench fill layer formed within the trench when forming from the etched partially chemical mechanical polish (CMP) planarized trench fill layer the planarized trench fill layer through a second chemical mechanical polish (CMP) method; and employing the second chemical mechanical polish (CMP) method to form from the etched partially chemical mechanical polish (CMP) planarized trench fill layer the planarized trench fill layer.

9. The method of claim 8 wherein the substrate is chosen from the group of substrates consisting of insulator substrates, semiconductor substrates and conductor substrates.

10. The method of claim 8 wherein the conformal trench fill layer is chosen from the group of trench fill layers consisting of trench fill insulator layers, trench fill semiconductor layers and trench fill conductor layers.

11. The method of claim 8 wherein the width of the trench is greater than about 3 microns.

12. The method of claim 8 wherein the depth of the trench is from about 3000 to about 7000 angstroms.

13. The method of claim 12 wherein the thickness of the conformal trench fill layer is from about 7000 to about 9000 angstroms.

14. The method of claim 8 wherein the thickness of the conformal polish stop layer is from about 2000 to about 4000 angstroms.

15. A chemical mechanical polish (CMP) method for planarizing a conformal trench fill dielectric layer formed within an isolation trench within a semiconductor substrate comprising:

providing a semiconductor substrate, the semiconductor substrate having an isolation trench formed within the semiconductor substrate;

forming over the semiconductor substrate and within the isolation trench a conformal trench fill dielectric layer, the conformal trench fill dielectric layer being formed to a thickness greater than the depth of the isolation trench;

forming upon the conformal trench fill dielectric layer a conformal polish stop layer, the conformal polish stop layer having a lower planar region of the conformal polish stop layer where the conformal trench fill dielectric layer is formed within the isolation trench;

planarizing through a first chemical mechanical polish (CMP) planarizing method the conformal polish stop layer and the conformal trench fill dielectric layer until there is reached the lower planar region of the conformal polish stop layer while simultaneously forming a patterned polish stop layer and a partially chemical mechanical polish (CMP) planarized trench fill dielectric layer;

employing the patterned polish stop layer as an etch mask in etching portions of the partially chemical mechanical polish (CMP) planarized trench fill dielectric layer over regions of the semiconductor substrate other than the isolation trench to form an etched partially chemical mechanical polish (CMP) planarized trench fill dielectric layer having a protrusion over the isolation trench, where the height of the protrusion compensates for a dish otherwise formed within a planarized trench fill dielectric layer within the isolation trench when forming from the etched partially chemical mechanical polish (CMP) planarized trench fill dielectric layer the planarized trench fill dielectric layer through a second chemical mechanical polish (CMP) planarizing method; and employing the second chemical mechanical polish (CMP) planarizing method to form from the etched partially chemical mechanical polish (CMP) planarized trench fill dielectric layer the planarized trench fill dielectric layer.

16. The method of claim 15 wherein the width of the isolation trench is greater than about 3 microns.

17. The method of claim 15 wherein the depth of the isolation trench is from about 5000 to about 7000 angstroms.

18. The method of claim 17 wherein the thickness of the conformal trench fill layer is from about 7000 to about 9000 angstroms.

19. The method of claim 15 wherein the thickness of the conformal polish stop layer is from about 2000 to about 4000 angstroms.

* * * * *